US007099549B2

(12) United States Patent
Scheuer et al.

(10) Patent No.: US 7,099,549 B2
(45) Date of Patent: Aug. 29, 2006

(54) RADIAL BRAGG RING RESONATOR

(75) Inventors: Jacob Scheuer, Pasadena, CA (US);
Amnon Yariv, Pasadena, CA (US)

(73) Assignee: California Institute of Technology,
Pasadena, CA (US)

( * ) Notice: Subject to any disclaimer, the term of this patent is extended or adjusted under 35 U.S.C. 154(b) by 217 days.

(21) Appl. No.: 10/766,974

(22) Filed: Jan. 29, 2004

(65) Prior Publication Data

US 2004/0247008 A1    Dec. 9, 2004

Related U.S. Application Data

(60) Provisional application No. 60/447,155, filed on Feb. 12, 2003.

(51) Int. Cl.
*G02B 6/10* (2006.01)
(52) U.S. Cl. .................. 385/132; 385/14; 385/129; 372/94
(58) Field of Classification Search .............. 385/14, 385/27, 40, 129–132; 372/94
See application file for complete search history.

(56) References Cited

U.S. PATENT DOCUMENTS 5,159,650 A * 10/1992 Nishiwaki et al. ............ 385/37
5,448,581 A *  9/1995 Wu et al. ................. 372/45.01

* cited by examiner

*Primary Examiner*—Michelle Connelly-Cushwa
*Assistant Examiner*—James D. Stein
(74) *Attorney, Agent, or Firm*—Daniel L. Dawes; Myers Dawes Andras & Sherman LLP

(57) ABSTRACT

A resonator structure is presented comprising a closed loop resonator having a distributed Bragg reflector for confining the light within the guiding core. In one embodiment the light is confined from both the internal and the external sides of the device forming a guiding channel (defect) or just by the external side forming a disk resonator. Although the perfectly circular shape is generally preferred, the resonator could be of any closed loop shape such as an ellipse, etc. Although not mentioned explicitly throughout the text, the Bragg reflectors can of any type of distributed reflector such as, for example, a photonic bandgap crystal where the Bragg reflector is constructed by series of holes in a dielectric material. The resonator structure can be used in various applications, such as optical filters, lasers, modulators, spectrum analyzers, wavelockers, interleave filters, and optical add drop multiplexers.

14 Claims, 11 Drawing Sheets

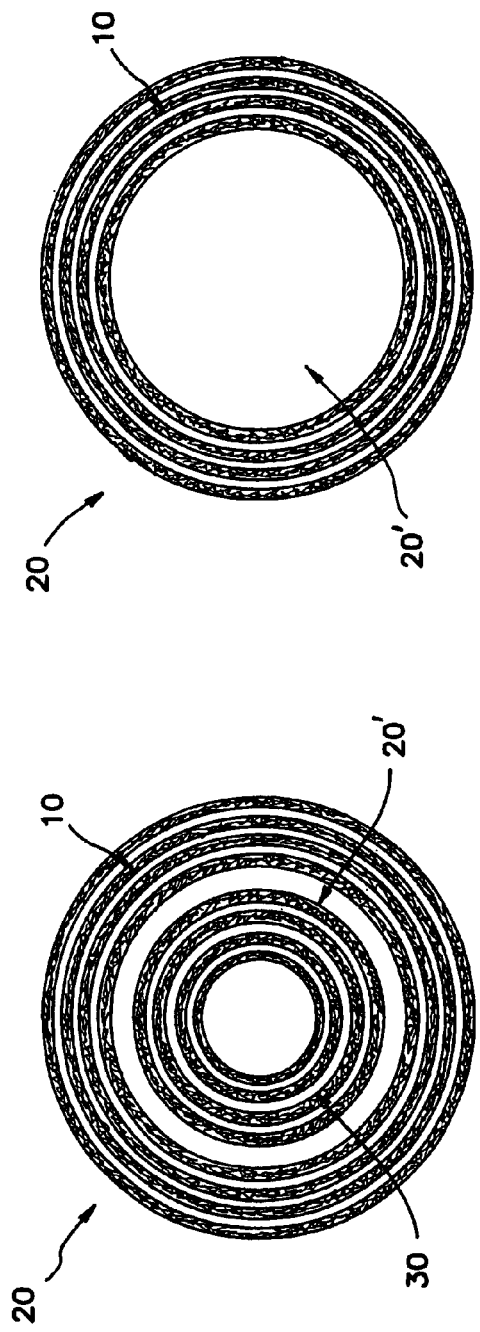
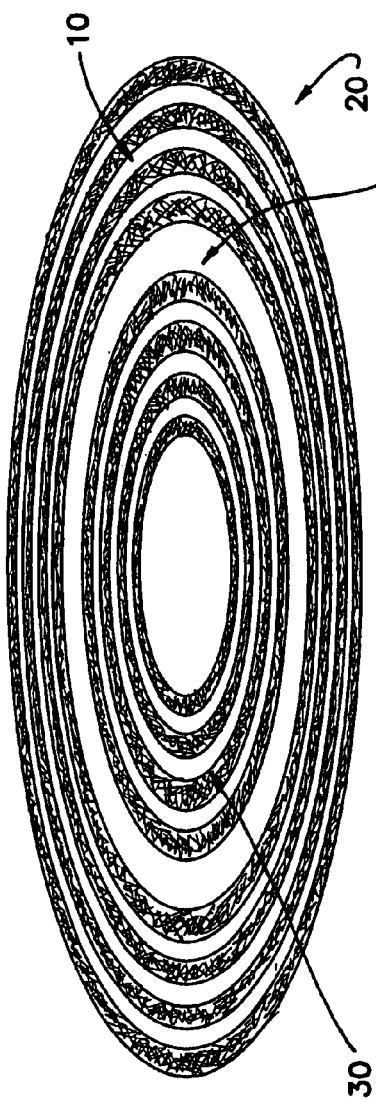
FIG. 2A
FIG. 2B
FIG. 2C

LIGHT PROPAGATION
DIRECTION

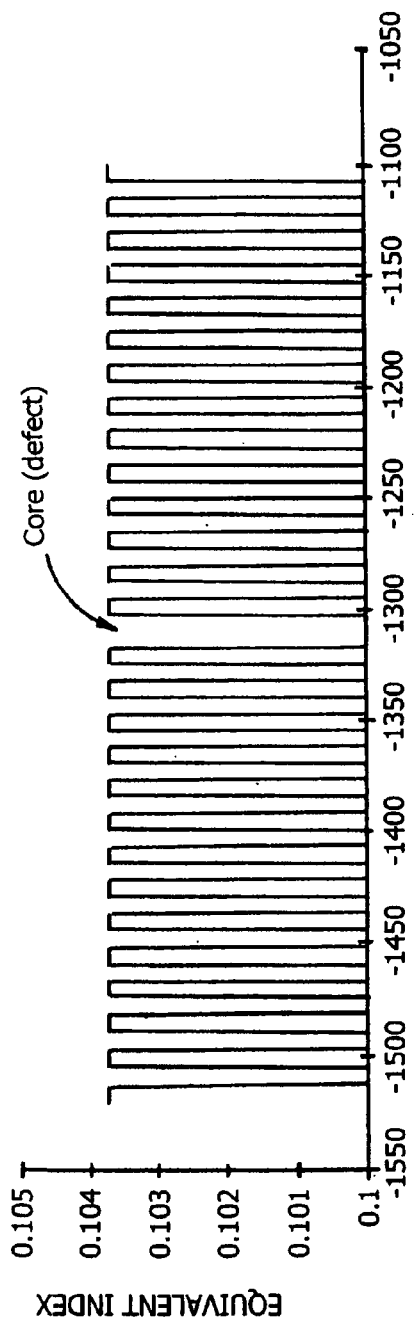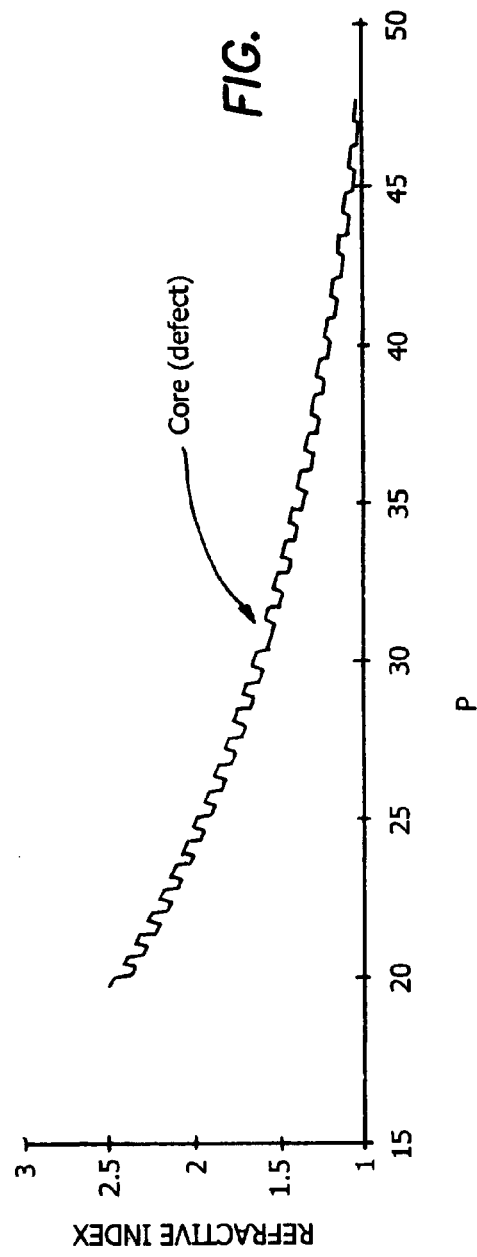

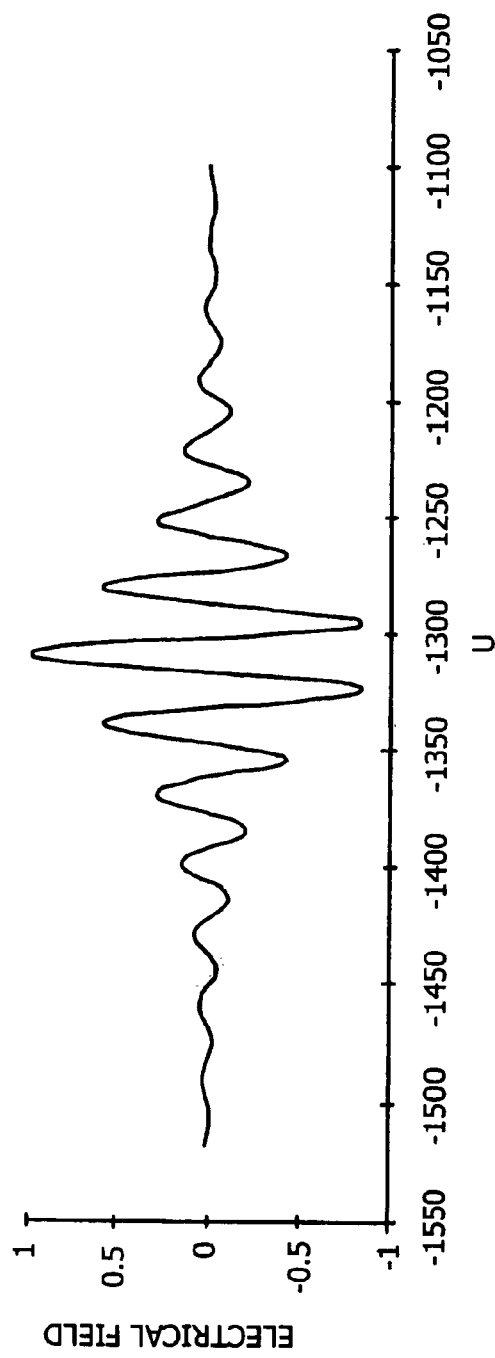
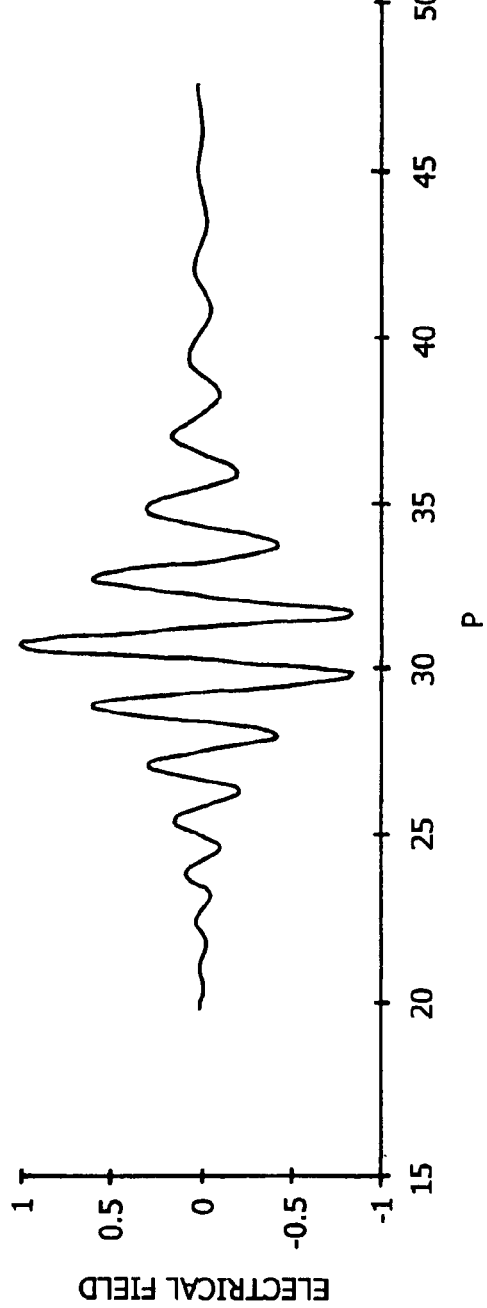
FIG. 8A
FIG. 8B

RADIAL BRAGG RING RESONATOR

RELATED APPLICATIONS

The present application is related to U.S. Provisional Patent Application Ser. No. 60/447,155, filed on Feb. 12, 2003, which is incorporated herein by reference and to which priority is claimed pursuant to 35 USC 119.

BACKGROUND OF THE INVENTION

1. Field of the Invention

This invention relates to resonant optical cavities and more particularly to ring-like cavities used in integrated optical devices.

2. Description of the Prior Art

An optical resonator is an important element, which can be incorporated into many of the components used for optical communication systems such as lasers, filters, routers, switches, etc. Such resonator can be easily realized in integrated optical devices with linear waveguides to form a planar lightwave circuit (PLC). One of the most common roles of the optical resonator is to serve as a wavelength dependent coupler between two (or more) waveguides (input/output (I/O) waveguides). This is schematically illustrated in FIGS. 1A and 1B, wherein a circular resonator serves for coupling between two linear waveguides. The light couples from one (input) linear waveguide into the resonator waveguide and from the resonator to the other (output) linear waveguide. In specific wavelengths, known as the resonance wavelengths of the resonator structure, all the light is eventually transferred from the first linear waveguide to the second linear waveguide. The resonator is typically characterized by following parameters:

Free spectral range (FSR);

Loss per revolution;

Coupling to the waveguides;

Q factor, which can be derived from the three parameters defined above.

If the material of which the resonator is made of is "active" (i.e. able to provide optical gain), the resonator could operate as a laser, emitting light in the resonance frequencies of the device.

Ring resonators in planar technology are generally comprise of a closed loop waveguide which is made of a material with a higher refractive index than its surrounding (see for example B. E. Little et al., "*Vertically coupled glass microring resonator channel dropping filters*", IEEE Photonics Technology Letters vol. 11 no. 2, February 1999, p. 215–217). Here, $n_s$ is the refractive index of a substrate, $n_g$, $W_g$ and $h_g$ are the refractive index, width and height respectively of the input/output waveguides, $n_r$, $W_r$ and $h_r$ are the refractive index, width and height, respectively, of the ring, and $n_0$ is the refractive index of a cladding layer as depicted in FIG. 1C.

Such implementation has several disadvantages. Characteristics such as large FSR and low loss are important for a micro-ring resonator, regardless the specific function it fulfills. However, achieving these characteristics simultaneously is difficult since the demands on the resonator shape conflict. To achieve large FSR resonator, the best design would be a circular ring with high refractive index contrast to achieve tight mode profiles. However, these characteristics would result in high losses which stem from three different mechanisms:

Bend radiation losses;

The smaller the core radius the higher the losses;

Core material absorption and scattering (material loss);

Surface scattering from the roughness of the core walls.

These losses increase with the core-clad index contrast.

There is therefore a need in the art to design a resonator structure that provides for large FSR and low loss/rev. The performance of a resonator-based device of any kind significantly depends on the resonator loss. There are two primary mechanisms that induce losses in the resonator, namely material loss and radiation loss. Material loss is an inherent property of the material comprising the resonator, and is an exponential function of the length of the resonator. As for the radiation loss, it arises from the waveguide imperfections such as surface roughness, and from the bend related radiation loss. The surface roughness is similar in effect to the material dependant loss and depends on the waveguide shape and refractive index. The bend related loss also depends on the waveguide shape and refractive index, but also critically depends on the radius of curvature. In order to decrease the radiation losses, what is needed is a resonator with large and smooth curvatures. This, however, would result in a very small FSR, and also would increase overall length of the resonator and increase losses related to the material and surface roughness loss. Hence, the current solutions cannot provide reduction of the loss of a resonator below a certain value.

BRIEF SUMMARY OF THE INVENTION

The invention solves the above problems by utilizing a different method of confining the light which allows for small bending radii (and therefore large FSR) and low losses. The improved resonator structure utilizes radial Bragg reflectors in order to confine the light in a guiding defect. Unlike conventional resonators, the guiding channel could be comprised of low index material or even air, which can reduce significantly the material related loss. The utilization of radial Bragg reflectors can also reduces the bending loss of the field in the resonators (the decreases as a function of the Bragg layers number) and yet allow for small bending radii (large FSR).

The inventors have found that the utilization of Bragg reflectors as a method of confining the light to the guiding channel can decrease significantly the radiation losses of the resonator, while allowing for large FSR. The closed loop resonator waveguide of the present invention can be used in a variety of applications such as optical filters, lasers, modulators, spectrum analyzers, wavelockers, interleave filters, optical add drop multiplexers and other applications.

In one embodiment the light is confined from both the internal and the external sides of the device forming a guiding channel (defect) or just by the external side forming a disk resonator. Although the perfectly circular shape is generally preferred, the resonator could be of any closed loop shape such as an ellipse, etc. Although not mentioned explicitly throughout the text, the Bragg reflectors can of any type of distributed reflector such as, for example, a photonic bandgap crystal where the Bragg reflector is constructed by series of holes in a dielectric material.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 1A is a top plan view which illustrates a ring resonator and FIG. 1B is a top plan view which illustrates a disk resonator. FIG. 1C is a diagrammatic cut-away perspective view which shows a ring resonator in planar technology taking the form of a closed loop waveguide.

FIGS. 2A–2D are schematic top plan views which illustrate a resonator structure according to the invention utilizing Bragg reflectors. FIG. 2A is a diagrammatic top plan view which illustrates a Bragg ring resonator. FIG. 2B is a diagrammatic top plan view which illustrates a Bragg disk resonator. FIG. 2C is a diagrammatic top plan view which illustrates an arbitrary closed loop Bragg resonator. FIG. 2D is a diagrammatic top plan view which illustrates a resonator comprised of two straight sections and two curved but not necessarily circular sections. The embodiments of FIGS. 2C–2D have an oval or elliptical shape.

FIGS. 7A and 7B are graphs of the equivalent index and refractive index respectively of an optimal resonator.

FIGS. 8A and 8B are graphs of the electrical field in the equivalent and real planes respectively.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1A:
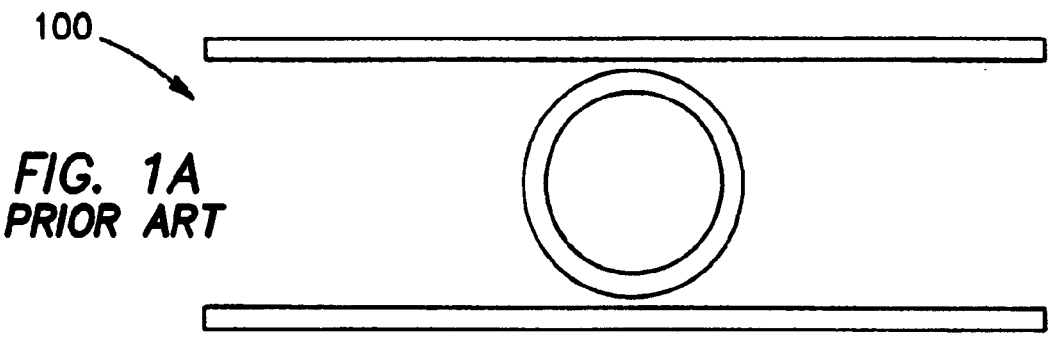
FIGS. 1A–1C are schematic illustrations of a prior art microresonator.
Figure 1B:
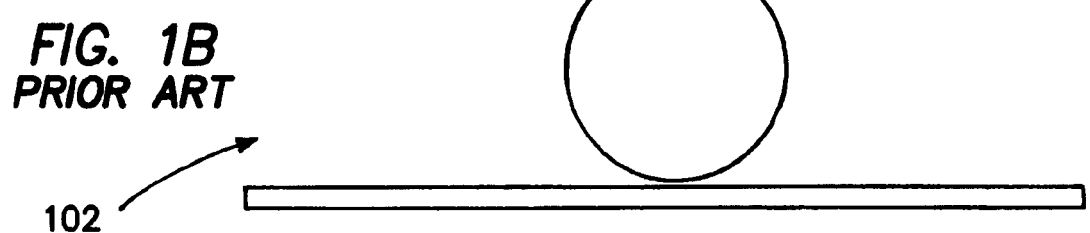
Figure 1C:
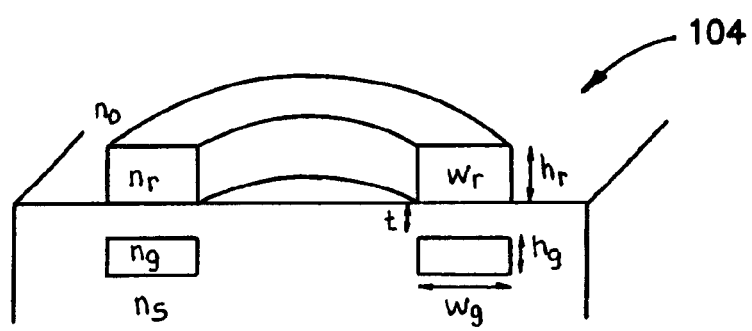

FIGS. 1A–1C are diagrams which illustrate the prior art ring resonator structure. FIGS. 1A and 1B are top plan view diagrams which show structures utilizing, respectively, a ring resonator 100 and a disk resonator 102. FIG. 1C is a perspective diagram which shows a structure utilizing circular resonator 104 and a multi-layer approach such as described in "*Vertically Coupled Glass Microring Resonator Channel Dropping Filters*", B. E. Little et al., IEEE Photonics Technology Letters vol. 11 no. 2, Feb. 1999, p. 215–217.

Figure 2D:
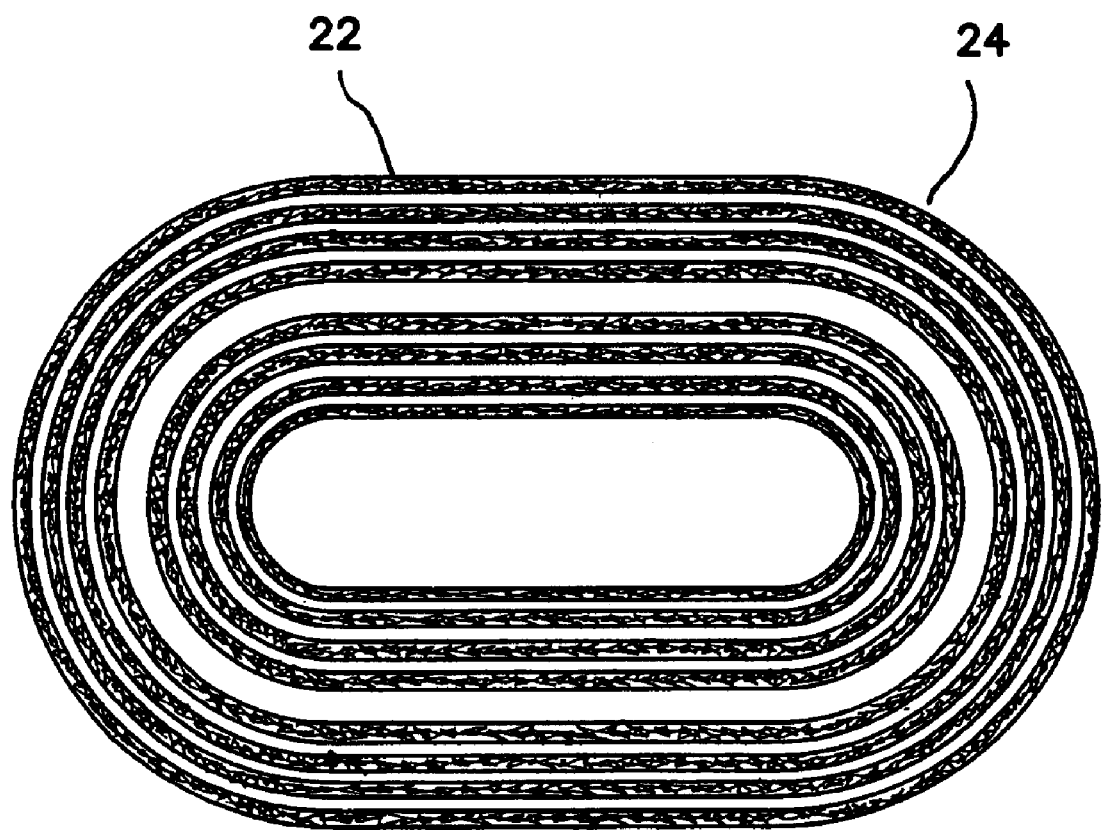

Referring to FIGS. 2A–2D, the resonator 20 according to the invention is illustrated by example in several embodiments in top plan view. In the embodiment of FIG. 2A, resonator 20 comprises a plurality of external Bragg reflectors 10, a guiding channel 20' and a plurality of internal Bragg reflectors 30. In the embodiment of FIG. 2B, resonator 20 comprises a plurality of external Bragg reflectors 10 and a guiding core or channel 20'. In the embodiment of FIG. 2C also shown in diagrammatic top plan view, resonator 20 is similar to the structure of FIG. 2A, except that the resonator shape is not perfectly circular, but eccentric. The resonator 20 can also be comprised of straight sections 22 and bent sections 24 as shown in FIG. 2D. The resonator profiles depicted in FIGS. 2C–2D are denoted as oval. It is expressly contemplated that any closed loop geometry desired can be employed in the context of the invention and resonator 20 is not limited to the profiles of FIGS. 2A–2D.

Figure 3:
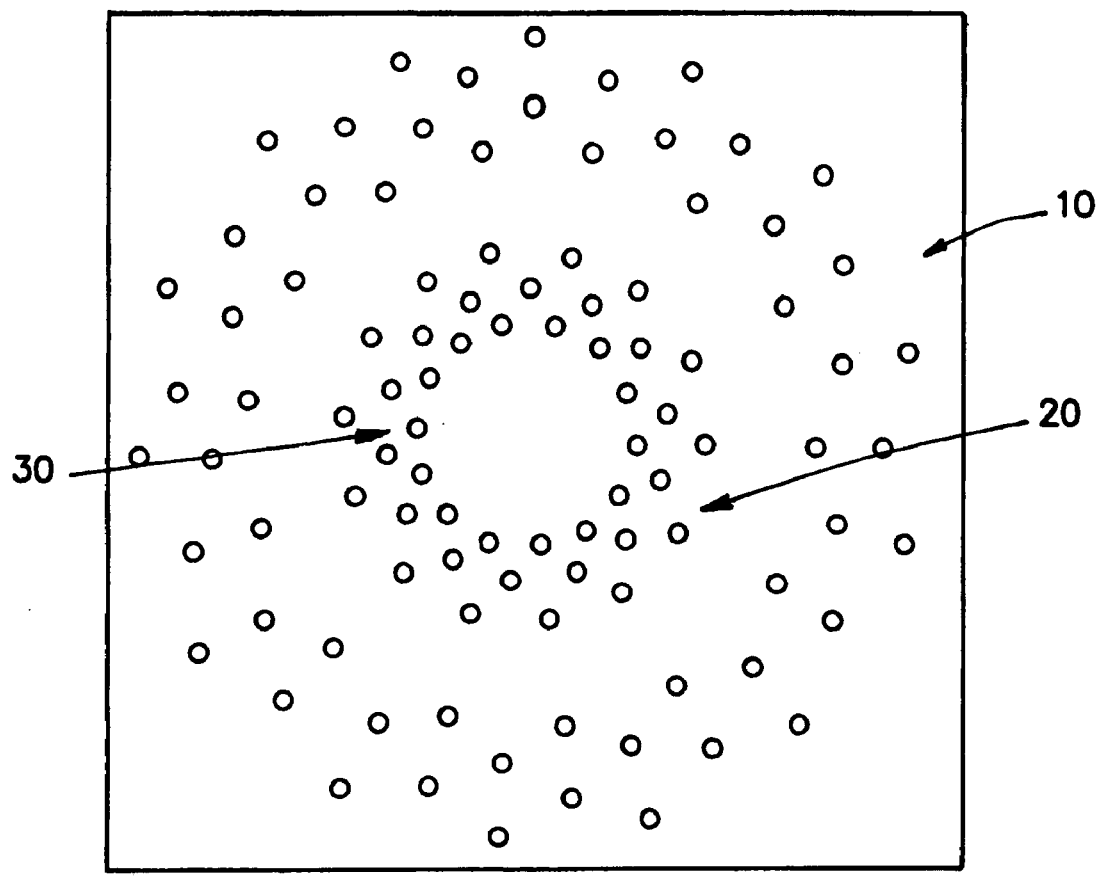
FIG. 3 is a diagrammatic top plan view which schematically illustrates an implementation of a Bragg ring resonator utilizing a photonic bandgap crystal.

FIG. 3 is a top plan view diagram which illustrates a radial Bragg resonator 20 similar to that shown in FIG. 2A in which the Bragg reflectors 10 and 30 are of comprised of photonic bandgap crystal (PBC) structures, namely periodic arrays of index of refraction discontinuities, typically arrays of air holes defined through semiconductor substrates.

Figure 4:
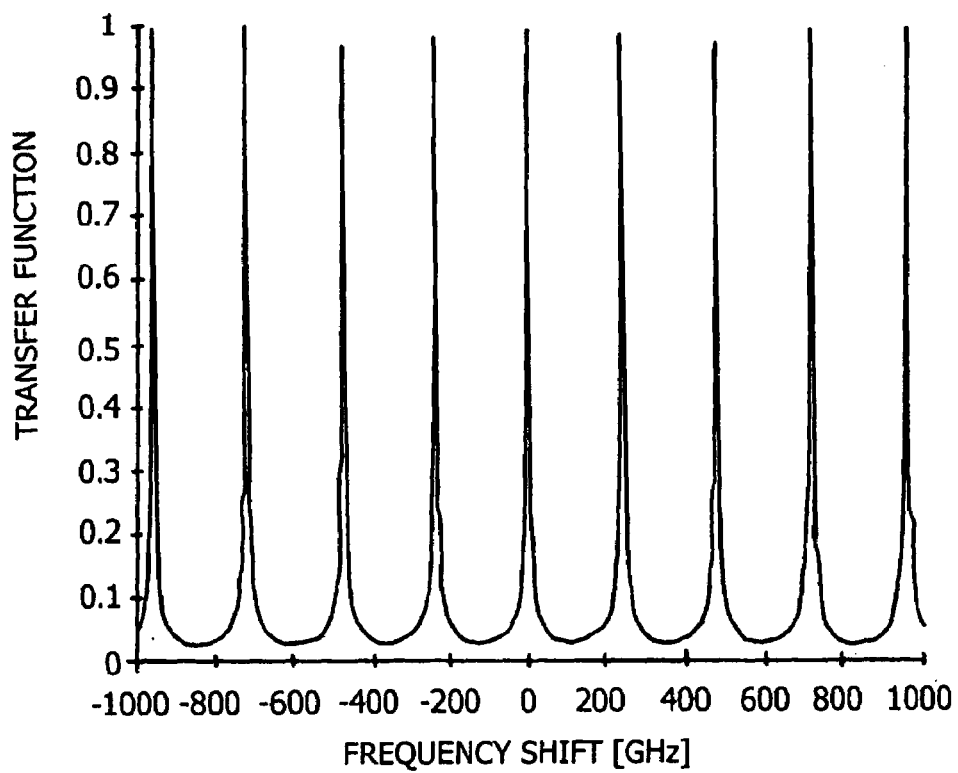
FIG. 4 is a graph of the transfer function verses the frequency shift and shows the output spectra of a ring-resonator as illustrated in FIGS. 1A–1C.

FIG. 4 is a graph which shows the transfer function as a function of a frequency shift from the resonance frequency which presents a ratio between the drop output and input spectra of a ring-resonator-channel-drop filter using a ring resonator of the invention. By varying the refractive indices of the material in the filter, the resonance frequencies can be changed, and thus enabling the development of tunable devices (such as filters and lasers) based on the tunable resonator 20. The tuning can be achieved by variety of mechanism such as heating the resonator 20 (thermo-optic effect), subjecting it to an electric field (electro-optic effect), mechanical pressure, free carrier injection change of refractive index, piezoelectric effect, etc.

Figure 5:
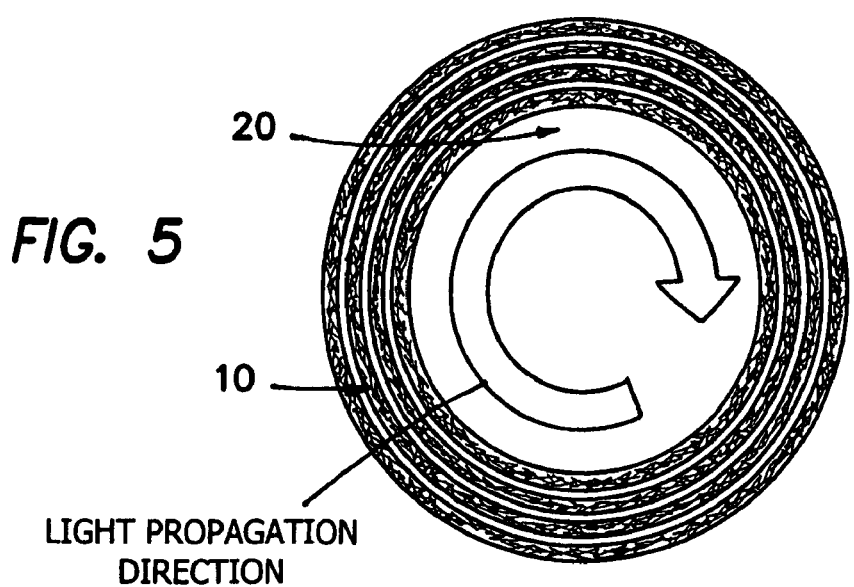
FIG. 5 is a diagrammatic top plan view which schematically illustrates an implementation of a radial Bragg resonator according to the invention in a laser.

FIG. 5 is a top plan view diagram which illustrates an implementation of a laser structure using a Bragg disk resonator. The guiding core 20' is comprised of an "active" medium and is pumped electrically or optically in order to enable light amplification. The external Bragg reflectors 10 confine the light within the resonator 20 and thus enabling the lasing.

Figure 6B:
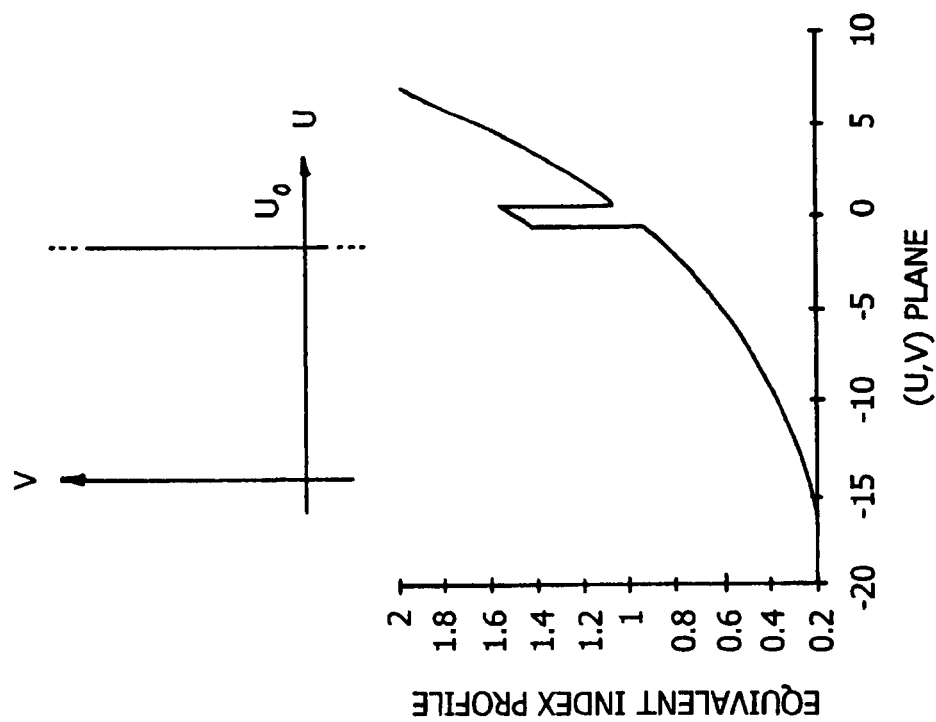
FIGS. 6A and 6B are graphs of the real index profile and equivalent index profile respectively and illustrate a conformal mapping which was employed in the invention.
Figure 6A:
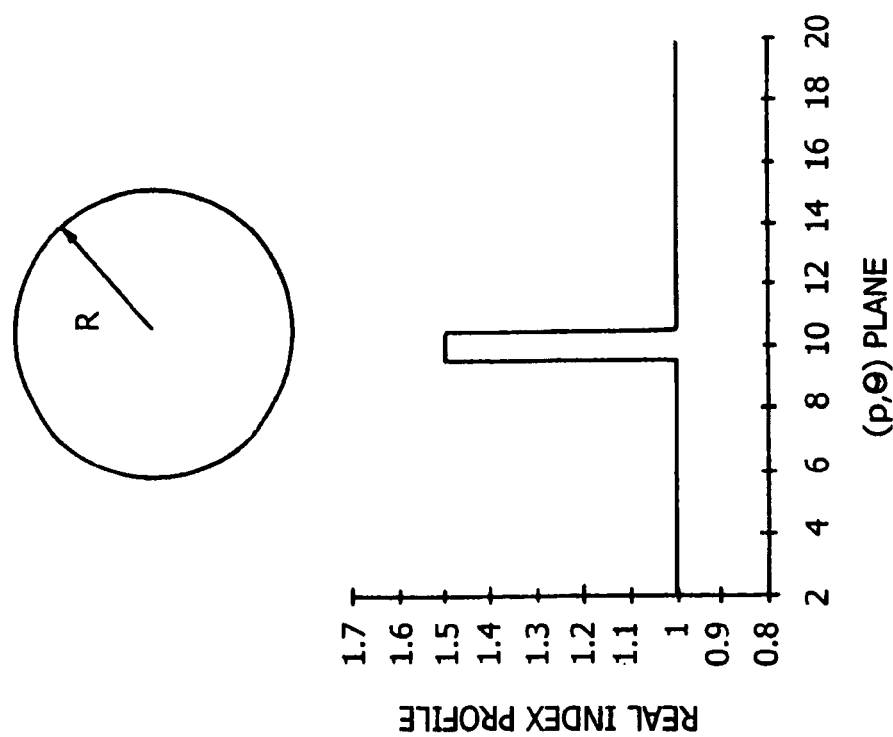

The present invention provides a resonator 20 which has a smaller radiation loss of the resonator below previously existing limits, while, of course, maintaining a large FSR. The modal electrical field satisfies the Helmholtz equation which, in cylindrical coordinates is given by:

$$\frac{1}{\rho}\frac{\partial}{\partial\rho}\left(\rho\frac{\partial E}{\partial\rho}\right) + \frac{1}{\rho^2}\frac{\partial^2 E}{\partial\theta^2} + k_0^2 n^2(\rho)E = 0$$

where $\rho$ and $\theta$ are the radial and azimuthal coordinates respectively and $k_o$ is the wave number in vacuum. In order to transform the annular waveguide to a straight one, we utilize a following conformal transformation:

$$\rho = R \cdot \exp(U/R)$$

$$\theta = V/R$$

where R is an arbitrary parameter. As illustrated in the graphs of FIG. 6, the transformation maps a circle in the real plane with radius Ro to a straight line located in $U_0 = R \ln(R_0/R)$. The structures in FIGS. 2A–2B are transformed into a series of straight lines. The wave equation in the (U, V) plane is obtained by transforming:

$$\frac{\partial^2 E}{\partial U^2} + \frac{\partial^2 E}{\partial V^2} + k_0^2 n_{eq}^2(U)E = 0$$

where $n_{eq}(U) = n(U) \exp(U/R)$ is the profile of the refractive index in the (U, V) plane. The transformation maps the annular waveguide of FIGS. 1A–2D into a straight waveguide in the (U, V) plane. Since the requirements for a confined straight Bragg waveguide and specifically, $n_{eq}(U)$ in the (U, V) plane are known, the refractive index profile $n(\rho)$ in the real plane can be simply found by the inverse transformation of the confined straight Bragg waveguide solution.

Figure 12A:
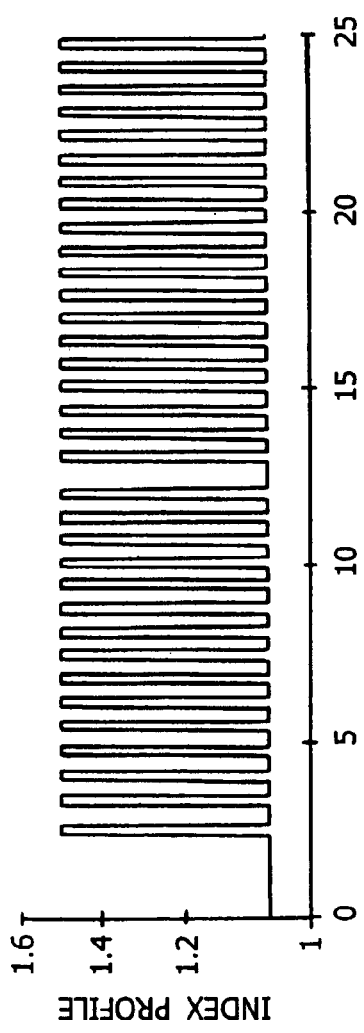
FIGS. 12A and 12B are graphs of the index profile and the field intensity as a function of radius respectively of a Bragg ring resonator with chirped grating period.
Figure 12B:
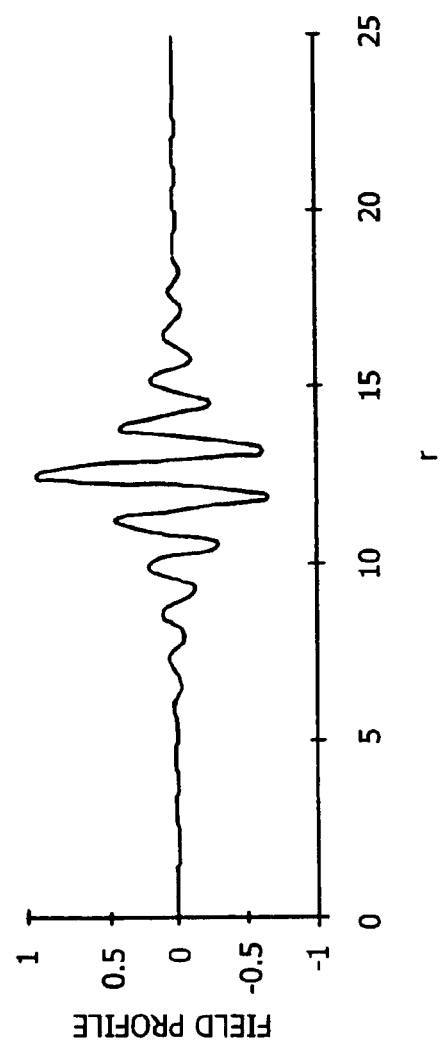

FIGS. 7A and 7B are graphs which depict how a Bragg waveguide in the (U, V) plane with a guiding channel or core 20', treated as a "defect" or perturbation in the periodic array of the surround Bragg reflectors, is transformed to the ($\rho$, $\theta$) plane. The gratings in the ($\rho$, $\theta$) plane are spatially "chirped" i.e., their period changes as a function of the radius $\rho$. FIGS. 12A and 12B are graphs of the index profile and the field intensity as a function of radius respectively of a Bragg ring resonator with chirped grating period.

In addition, the gratings' index and index contrast become smaller for larger $\rho$. This effect is caused by the $1/\rho$ factor multiplying the inverse-transformed index. Since the mode of this waveguide is solved exactly in the (U, V) plane, the field solution can be readily transformed to the ($\rho$, $\theta$) plane. We start with the known solution for the transformed problem in the (U, V) plane:

$$E(U,V) = \overline{E}(U) \cdot \exp(i\beta V)$$

where $\beta$ is the propagation coefficient. The required core width and the resulting mode profile depend on the specific type of array used to generate the Bragg reflection (Bragg layers, triangular PBC, etc). For a triangular lattice PBC, for example, the required core width is given by $W_{triangPBC} = (s+\frac{1}{2}) b/l$; $s = 0, 1, 2 \ldots$ and the dispersion relation is given by:

$$\beta_{triangPBC} = \sqrt{k_0^2 \varepsilon_{eq,0} - (l\pi/b)^2} \; ; l = 1, 2, 3 \ldots$$

Where $\varepsilon_{eq,0}$ is the equivalent dielectric constant in the core, b is the period of the Bragg array and l indicates the Bragg order. Unlike the triangular PBC, the perturbation in the light caused by the Bragg layers case is purely imaginary and, as a result, the required core width is:

$$W_{Bragg\;layers} = s \cdot b/l; s = 1, 2, 3 \ldots$$

The dispersion relation, however, remains the same. For the Bragg layers case and $l=1$, the light perturbation is given by:

$$(\Delta n_{eq})_1^2 = \frac{1}{\pi i}\left((n_{eq}^{max})^2 - (n_{eq}^{min})^2\right)$$

The lowest order solution (mode) of the wave equation is given by:

$$\overline{E}(U) = \begin{cases} E_0 \cos\left(\frac{\pi}{b}(U - U_{cent})\right) & |U - U_{cent}| \leq \frac{b}{2} \\ E_0 \cos\left(\frac{\pi}{b}(U - U_{cent})\right) \exp\left\{-\kappa_1\left(U - U_{cent} - \frac{b}{2}\right)\right\} & |U - U_{cent}| \geq \frac{b}{2} \\ E_0 \cos\left(\frac{\pi}{b}(U - U_{cent})\right) \exp\left\{\kappa_1\left(U - U_{cent} + \frac{b}{2}\right)\right\} & |U - U_{cent}| \leq -\frac{b}{2} \end{cases}$$

where $$\kappa_1 = 2b\left[(n_{eq}^{max})^2 - (n_{eq}^{min})^2\right]/\lambda^2$$

and $U_{cent}$, is the coordinate of the center of the guiding channel. The arbitrary transformation parameter R and the value of Ucent, determine the radius of the guiding channel in the ($\rho$, $\theta$) plane according to $$\rho_{cent} = R \cdot \exp(U_{cent}/R)$$

The radial width $\Delta\rho$ of the defect or guiding channel 20' is determined similarly.

FIGS. 8A–8B are graphs by which one can compare the field profile in the (U, V) plane in FIG. 8A and in the ($\rho$, $\theta$) plane in FIG. 8B for a Bragg layer reflector. For single-valuedness the modal field in the circular resonator $E(\rho, \theta) = E(\rho) \cdot \exp(i\beta R\theta))$ satisfy the cyclic boundary condition $E(\rho, \theta) = E(\rho, \theta + 2\pi)$ and, therefore, the azimuthal propagation coefficient (the phase shift per revolution) must be an integer:

$$\beta R = \sqrt{k_0^2 \cdot (n_{eq}^{min})^2 - (l \cdot \pi/b)^2} \cdot R = m \quad m = 1, 2, 3 \ldots$$

For a given m, the field $E^m(\rho, \theta)$ corresponds to a mode of a new type of resonator formed by the annular defect or core. The free spectral range (FSR) of this resonator is given by:

$$FSR = \frac{dv}{dm} = \frac{c \cdot \sqrt{(2n_{eq}^{min} \cdot v)^2 - (c \cdot l/b)^2}}{(2n_{eq}^{min})^2 R\pi \cdot v}$$

Where c is the speed of light in vacuum and v is the optical frequency. The FSR increases if the second term in the numerator is made as small as possible, i.e. if l=1 and b is as large as possible. If b is large enough that $$\frac{2n_{eq}^{min}}{\lambda} \gg \frac{1}{b}$$

then the FSR is given by:

$$FSR \approx \frac{c}{2n_{eq}^{min} \pi R}$$

It follows from the last equation that the smaller the value of $n_{eq}^{min}$ the larger the FSR. As noted above, in the (U, V) plane, $n_{eq}^{min}$ can be arbitrarily small (as in FIG. 7B where $n^{eqmin}$ =0.1). The limitation is of course on the real refractive index (FIG. 2B), but for large R, $n_{eq}^{min}$ could be made as small as required.

Another important aspect of the structure is that its loss per revolution is determined by the Bragg structure and not by the bending radius as in conventional ring resonators. By adding more Bragg layers to the large ρ or external side of the defect or guiding channel 20', the loss can be made arbitrarily small. In addition, because of the strong Bragg confinement, the defect or guiding channel 20' can be located at any arbitrary radius.

Although the index profile shown FIG. 7B is the optimal index for an annular Bragg waveguide, it is considered more difficult to manufacture using conventional processing techniques than for a conventional Bragg reflector, especially because it requires a continuous change in the refractive index value in the conventional processing techniques. Another optional index profile would be an alternating two-level index such as used in various applications such as DFB and DBR lasers, gratings assisted couplers, etc. However, because of the radial nature of the device, conventional constant λ/4 layers, as implemented in lasers, are insufficient and a changing grating period must be utilized.

Figure 9:
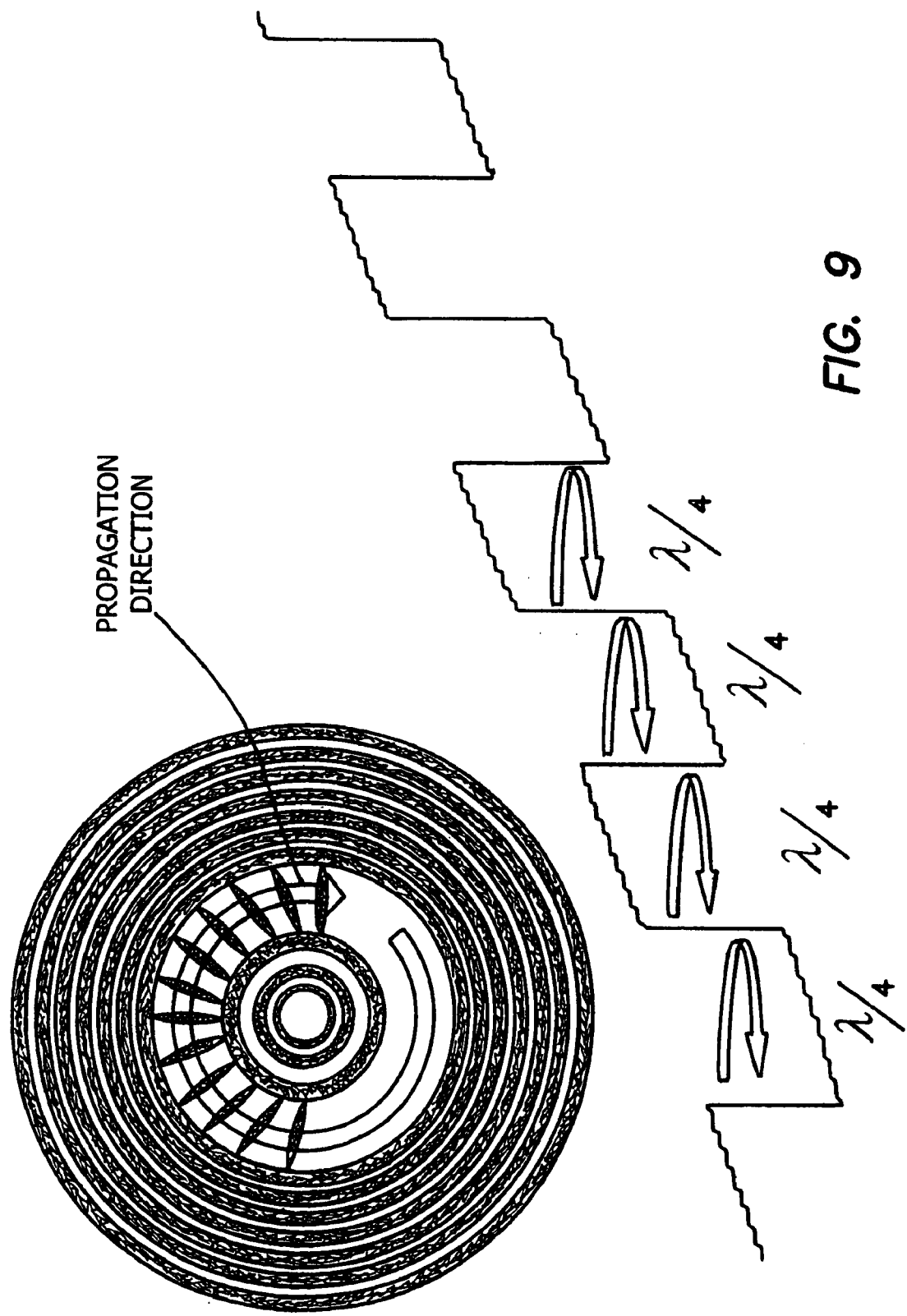
FIG. 9 is a top plan view diagram which illustrates the method to calculate the Bragg layers' widths for a "practical" brag Resonator.

FIG. 9 is a diagrammatic top plan view which schematically depicts the equivalent index $n_{eq}$ profile of an alternating two-level refractive index structure. In order for the structure to act as a Bragg reflector, all the partial reflections from the interfaces must interfere constructively in the internal edge of the reflector. For that to happen, each layer much act effectively as a λ/4 layer. Since the equivalent index changes according to the U coordinate (the equivalent radius), the condition on the layer thickness is given by:

$$\frac{\pi}{2} = \int_{u_1}^{u_2} k_\perp \cdot du = \int_{u_1}^{u_2} \sqrt{k_0^2 n_{eq}(u)^2 - m^2/R^2} \cdot du$$

where m is the required azimuthal number, R is the radius of the internal edge of the reflector, $u_1$ and $u_2$ are respectively the initial and end radii of a Bragg layer. Designing the Bragg layers according to this criterion insures the decaying of the electrical field outside the core. Although the above-mentioned explanation referred to equivalent λ/4 layers, it is possible to utilize any layer which equivalently acts as any multiple integer of λ/4 layer.

Figure 10A:
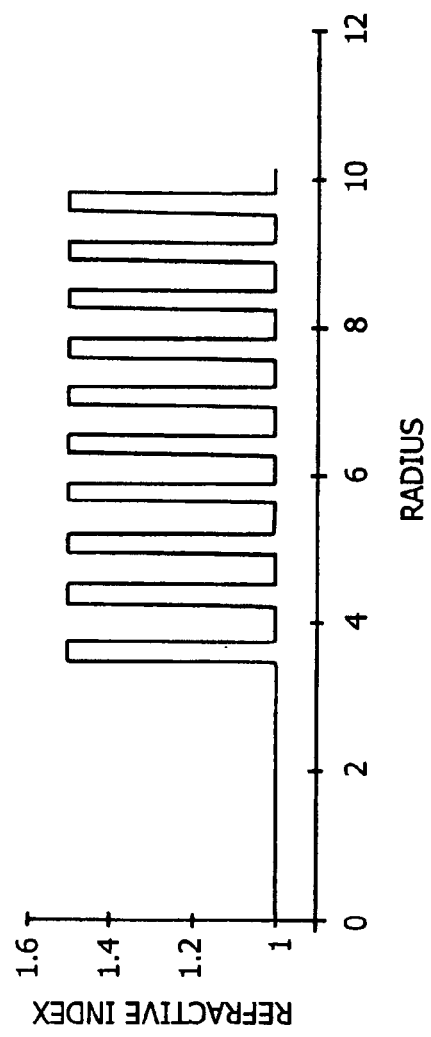
FIGS. 10A and 10B are graphs which depict the index profile and the field intensity as a function of radius respectively of a Bragg disk resonator with a chirped grating period.
Figure 10B:
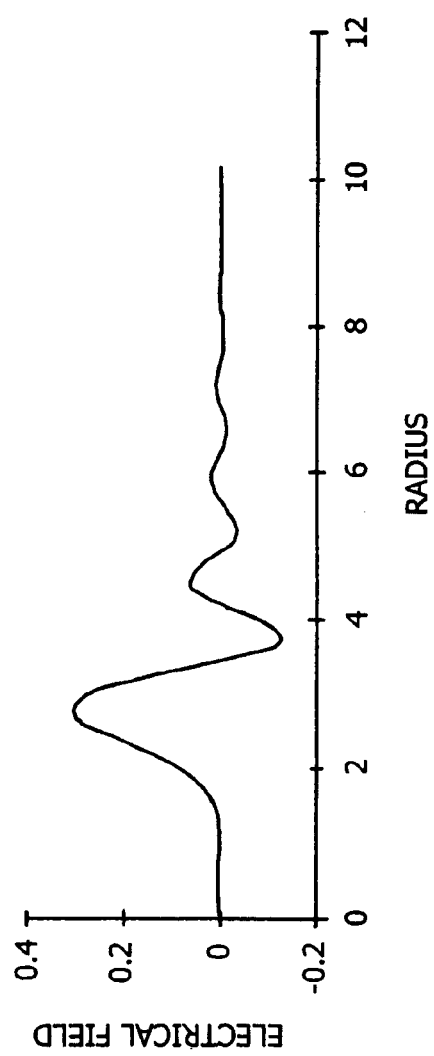

FIG. 10A is a graph which depicts the index profile of a radial Bragg reflector that was designed according to the principles detailed in the previous paragraph. In this example, the core index is 1.0 or air, and the layers indices are 1.5 and 1.0. One of the two levels of the index of the reflector need not equal the index of the core, but such a choice is the simplest fabricated embodiment. The reflector radius is 3.5 μm and the wavelength is 1.55 μm. The field profile is shown in the graph of FIG. 10B. The modal electric field has a peak approximately at 3 μm radius and it has a negligible value at radii larger than 9 μm. This example proves that unlike conventional resonators, the invented structure allows for extremely small resonators (large FSR) with low bend losses can be constructed using low index materials and an air core.

Figure 11:
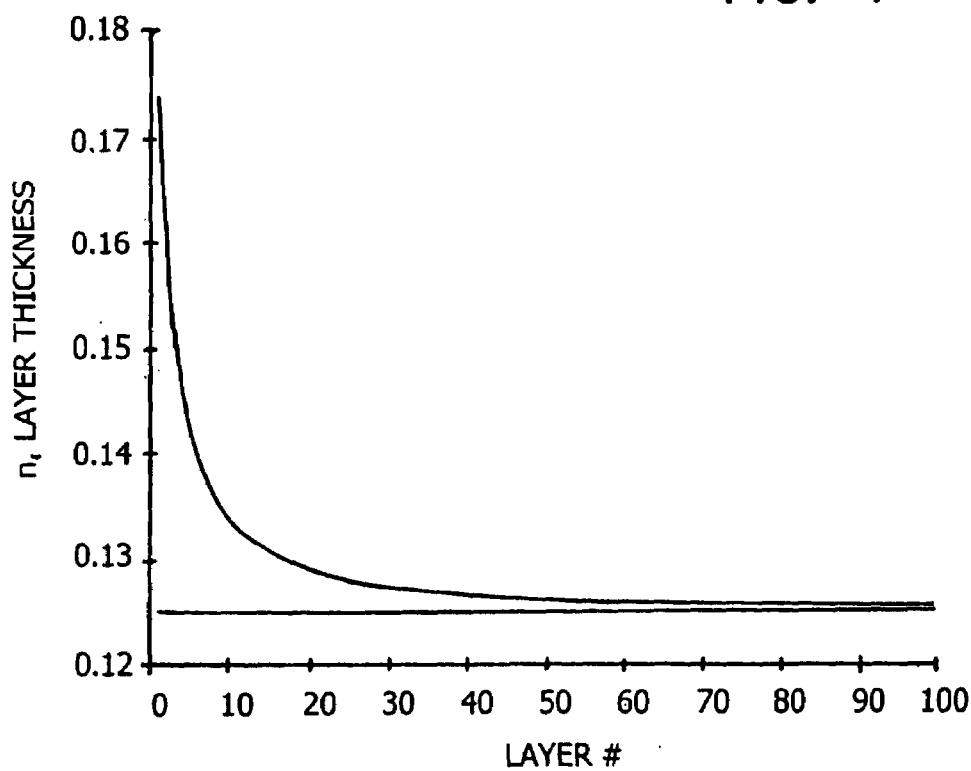
FIG. 11 is a graph of layer thickness as a function of layer number to compare the layers' width of the optimal structure to a conventional Bragg reflector.

FIG. 11 compares between conventional Bragg grating structure and the optimal gratings needed for the structure shown in FIGS. 9, 10A and 10B. Although distant grating period approach the conventional Bragg value, the width of first 20 layers, which are the most important for tight mode confinement, differ from that value significantly. FIGS. 12A and 12B are graphs of the index profile and the field intensity as a function of radius respectively of a Bragg ring resonator with chirped grating period as shown in FIG. 10A.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A semiconductor resonator structure comprising:
   a light transmissive substrate;
   a guiding channel defined in the substrate; and
   at least two distributed gratings defined in the substrate surrounding the guiding channel by at least two opposing sides of the guiding channel, wherein either the period of each of the gratings or their refractive index or both are not constant,
   wherein the gratings have an index profile given by $n(\rho)=n_{eq}(\rho) R/\rho$ and $n_{eq}(\rho=R \exp(U/R))$ has a conventional Bragg grating index profile, where $\rho$ is the radial polar coordinate, $n(\rho)$ is the real index of refraction as a function of $\rho$, $n_{eq}(\rho)$ is the equivalent index of refraction as a function of $\rho$, U is a transformational coordinate given by $\rho=R \exp(U/R)$, and R is an arbitrary constant.

2. The structure of claim 1 wherein the channel has an external side and an internal side and where the gratings disposed on the external and internal sides are different.

3. A semiconductor resonator structure comprising:
   a light transmissive substrate;
   a guiding channel defined in the substrate; and
   at least two distributed gratings defined in the substrate surrounding the guiding channel by at least two opposing sides of the guiding channel, wherein either the period of each of the gratings or their refractive index or both are not constant,
   wherein the gratings are Bragg gratings comprised of layers with a width, $w=u_2-u_1$, determined according to $$\frac{\pi}{2} = \int_{u_1}^{u_2} \sqrt{k_0^2 n_{eq}(u)^2 - m^2/R^2} \cdot du$$

where $\rho$ is the radial polar coordinate shown as the integration variable u above, $k_0$ is the wave number in vacuum of the light propagating in the structure, $n_{eq}(\rho)$ is the equivalent index of refraction as a function of $\rho$, m is a predetermined azimuthal number, R is the radius of the internal edge of the grating, $u_1$ and $u_2$ are respectively the initial and end radii of a Bragg layer in the grating.

4. The structure of claim 1 wherein the shape of the resonator is circular.

5. The structure of claim 1 wherein the shape of the resonator is oval.

6. The structure of claim 1 wherein the index of refraction of the guiding core is smaller than the index of refraction of the surrounding distributed gratings.

7. The structure of claim 2 wherein the index of refraction of the guiding core is smaller than the index of refraction of the surrounding distributed gratings.

8. The structure of claim 1 wherein the distributed gratings are made of dielectric material.

9. The structure of claim 1 wherein at least part of the substrate is "active" and able to provide optical gain.

10. The structure of claim 1 wherein the distributed gratings are comprised of alternating index layers.

11. An-optical resonator with large free spectral range (FSR) and low losses comprising:
    an optical substrate;
    a guiding channel defined in the substrate; and
    at least one radial Bragg reflector adjacent to the guiding channel to confine light therein,
    where the guiding channel and adjacent radial Bragg reflector form a combination with a radial structure, wherein the combination is characterized by a refractive index profile defined by a periodic function superimposed on a decreasing function of radial position.

12. The optical resonator of claim 11 where the Bragg reflector is comprised of a plurality of radial layers having a distinct refractive index from the refractive index of the substrate, where the plurality of radial layers have an internal edge, and where the width of each layer is selected so that constructive interference of all partial reflections from the plurality of layers is obtained at the internal edge of the Bragg reflector.

13. The optical resonator of claim 12 where the optical resonator has a resonant frequency of light, where each layer of the Bragg reflector has a thickness and where the thickness of each layer is greater than the constant Bragg thickness for reflector at the resonant frequency of light and decreases asymptotically toward the constant Bragg thickness as the distance of the layer away from the guiding channel increases.

14. The structure of claim 13 wherein the thickness of each layers is $w=u_2-u_1$, determined according to $$\frac{\pi}{2} = \int_{u_1}^{u_2} \sqrt{k_0^2 n_{eq}(u)^2 - m^2/R^2} \cdot du$$

where $\rho$ is the radial polar coordinate shown as the integration variable u above, $k_0$ is the wave number in vacuum of the light propagating in the structure, $n_{eq}(\rho)$ is the equivalent index of refraction as a function of $\rho$, m is a predetermined azimuthal number, R is the radius of the internal edge of the grating, $u_1$ and $u_2$ are respectively the initial and end radii of a Bragg layer in the grating.

* * * * *

UNITED STATES PATENT AND TRADEMARK OFFICE
CERTIFICATE OF CORRECTION

| | | |
|---|---|---|
| PATENT NO. | : 7,099,549 B2 | Page 1 of 1 |
| APPLICATION NO. | : 10/766974 | |
| DATED | : August 29, 2006 | |
| INVENTOR(S) | : Scheurer et al. | |

It is certified that error appears in the above-identified patent and that said Letters Patent is hereby corrected as shown below:

Col. 1, line 9 insert,

--Ths U.S. Government has certain rights in this invention pursuant to Grant No. N00014-03-1 awarded by the Office of Naval Research.--

2. At claim 11, col. 10, line 11, delete "An-optical" and insert --An optical--.

3. At claim 14, col. 10, line 41, delete "structure" and insert --optical resonator--.

Signed and Sealed this

Seventeenth Day of April, 2007

JON W. DUDAS
*Director of the United States Patent and Trademark Office*